US006972961B2

(12) United States Patent
Erskine (10) Patent No.: US 6,972,961 B2
(45) Date of Patent: Dec. 6, 2005

(54) SYSTEMS AND METHODS FOR A TONGUE AND GROOVE ARRANGEMENT FOR AN ELECTRONIC MODULE AND EQUIPMENT RACK

(75) Inventor: Terry Lee Erskine, Camarillo, CA (US)

(73) Assignee: POWER-ONE, Inc., Camarillo, CA (US)

(*) Notice: Subject to any disclaimer, the term of this patent is extended or adjusted under 35 U.S.C. 154(b) by 14 days.

(21) Appl. No.: 10/648,971

(22) Filed: Aug. 27, 2003

(65) Prior Publication Data

US 2004/0062014 A1 Apr. 1, 2004

Related U.S. Application Data

(60) Provisional application No. 60/415,714, filed on Oct. 1, 2002.

(51) Int. Cl.[7] ................................................ H05K 7/16
(52) U.S. Cl. ...................... 361/727; 361/741; 361/756; 361/802
(58) Field of Search ................................ 361/683–686, 361/724–731, 741, 752, 756, 796–797, 801, 361/802; 211/41.17, 26.2; 312/223.2

(56) References Cited

U.S. PATENT DOCUMENTS

| 3,447,036 A | 5/1969 | Dore et al. |
| 4,058,759 A | 11/1977 | Halfhill |
| 4,131,934 A | 12/1978 | Becker et al. |
| D264,960 S | 6/1982 | Secrest |
| 4,595,872 A | 6/1986 | Ball |
| D303,664 S | 9/1989 | Harden et al. |
| 4,963,098 A | 10/1990 | Myer et al. |
| D334,561 S | 4/1993 | Crater et al. |
| 5,385,481 A | 1/1995 | Kotyuk |
| D374,861 S | 10/1996 | Mousa |
| D376,347 S | 12/1996 | Mousa |
| 5,612,854 A | 3/1997 | Wiscombe et al. |
| 5,622,511 A | 4/1997 | Jarrett |
| D387,031 S | 12/1997 | Tracewell et al. |
| D387,032 S | 12/1997 | Tracewell |
| 5,808,867 A * | 9/1998 | Wang ......................... 361/695 |
| 5,901,057 A | 5/1999 | Brand et al. |
| D415,996 S | 11/1999 | Colver et al. |
| D429,213 S | 8/2000 | Colver et al. |

(Continued)

OTHER PUBLICATIONS

U.S. Appl. No. 10/649,243, filed Aug. 2003, Erskine.

*Primary Examiner*—Phuong T. Vu
(74) *Attorney, Agent, or Firm*—Knobbe, Martens, Olson & Bear, LLP (57) ABSTRACT

The invention is related to methods and apparatus for inserting and/or holding electronic modules into equipment racks. For example, the electronic module can correspond to a power supply, and the equipment rack can correspond to a shelf for a standardized equipment rack. One embodiment includes a handle that is movable from a first position to a second position. A power supply is inserted into an equipment rack with a handle in a first position. The first position of the handle permits partial insertion of the power supply, thereby permitting electrical connection of pre-charge contacts. The handle is then moved to a second position, thereby pulling in the power supply and permitting regular power contacts to make an electrical connection. One embodiment further includes a tongue and groove arrangement to prevent vertical displacement of an electronic module.

17 Claims, 11 Drawing Sheets

U.S. PATENT DOCUMENTS

| | | |
|---|---|---|
| 6,293,828 B1 | 9/2001 | Colver et al. |
| 6,388,875 B1 * | 5/2002 | Chen .......................... 361/685 |
| 6,392,901 B1 | 5/2002 | Colver et al. |
| 6,644,481 B2 | 11/2003 | Dean et al. |
| 2003/0123222 A1 | 7/2003 | Thompson et al. |
| 2004/0070922 A1 | 4/2004 | Erskine |

* cited by examiner

SYSTEMS AND METHODS FOR A TONGUE AND GROOVE ARRANGEMENT FOR AN ELECTRONIC MODULE AND EQUIPMENT RACK

RELATED APPLICATION

This application claims the benefit under 35 U.S.C. § 119(e) of U.S. Provisional Application No. 60/415,714, filed Oct. 1, 2002, the entirety of which is hereby incorporated by reference.

This application is related to copending application entitled FRONT HANDLE AND BEZEL FOR A RACK-MOUNT POWER SUPPLY, Ser. No. 10/649,243, filed on the same date as the present application, the entirety of which is hereby incorporated by reference.

BACKGROUND OF THE INVENTION

1. Field of the Invention

The invention generally relates to housings for electronics. In particular, the invention relates to rack-mountable electronic modules.

2. Description of the Related Art

Electrical equipment can be mounted in standard-sized equipment racks. These racks come in a broad variety of sizes, including, for example, a "2U" size. The "U" refers to a standard height dimension. Typically, a standard rack is about 19 inches or 23 inches in width. It will be understood, however, that the rack dimensions can vary. These racks can be used for a variety of purposes, such as for servers and other telecommunications equipment.

An equipment rack can hold electrical equipment for functional purposes, such as signal processing and data storage, and can also hold power supplies. Often, these power supplies are external to the signal processing or the data storage equipment. These power supplies convert power from direct current (DC) to DC, and also provide DC power from an alternating current (AC) source. The output voltages provided by power supplies can vary with the power requirements of the corresponding equipment to be powered. Output voltages of 24 volts and 48 volts are examples of typical biases that can be provided by a power supply.

SUMMARY OF THE INVENTION

Embodiments of the invention relate to methods and apparatus for inserting and/or holding electronic modules such as power supplies into equipment racks. One embodiment includes a handle that is movable from a first position to a second position.

A power supply is inserted into an equipment rack with a handle in a first position. When the handle is in the first position, pre-charge contacts make electrical contact such that capacitors within the power supply can be charged. The handle is then moved to a second position, thereby pulling in the power supply and permitting regular power contacts to make an electrical connection. One embodiment further includes a tongue and groove arrangement to prevent vertical displacement of the electronic module.

One embodiment includes a power supply adapted to slide into an equipment rack, where the power supply includes a housing with an interior, wherein the interior of the housing is adapted to house electronic circuits for the power supply; at least one connector on a back end of the housing, where the connector electrically couples the power supply to the equipment rack via electrical contacts, where the electrical contacts include at least pre-charge contacts and regular power contacts; and a mechanical interlock arrangement coupled to the power supply having at least a first state and a second state wherein the mechanical interlock arrangement permits partial insertion of the power supply into the equipment rack in the first state such that the pre-charge contacts have electrical continuity with corresponding contacts in the equipment rack and interferes with full insertion such that the regular power contacts do not have electrical continuity with corresponding contacts in the equipment rack, and where the mechanical interlock arrangement permits full insertion of the power supply into the equipment rack in the second state such that the regular power contacts can have electrical continuity with corresponding contacts in the equipment rack.

Another embodiment includes a handle for a plug-in power supply, where the handle includes: a first arm with a proximal end and a distal end, the first arm defining a bore between the proximal end and the distal end, where the handle couples to the power supply through the bore, where the handle is adapted to pivot about the bore; a grasping portion coupled to the proximal end of the first arm; a cam coupled to the distal end of the first arm, where the cam is adapted to permit partial insertion but prevent full insertion of the plug-in power supply when the handle is pivoted to a first position and to permit full insertion of the plug-in power supply when the handle is pivoted to a second position; and a hook coupled to the distal end of the first arm, where the hook is adapted to hold the power supply in an inserted position when the handle is pivoted to the second position.

Another embodiment includes a modular electronic system using a tongue and groove arrangement to restrain motion of electronic modules, where the modular electronic system includes: an equipment rack with a plurality of openings for receiving electronic modules, wherein an opening is defined by a left side wall, a right side wall, and a bottom surface, where the left side wall further defines a first groove disposed a first height above the bottom surface, where the right side wall further defines a second groove disposed a second height above the bottom surface, where the first height is different from the second height; and a plurality of electronic modules with housings adapted to slidably couple into openings of the equipment rack, where a housing for an electronic module further comprises at least a left side wall and a right side wall, where the left side wall of the electronic module comprises a first tongue that is adapted to mate with the first groove in a corresponding left side wall of the equipment rack, and where the right side wall of the electronic module comprises a second tongue that is adapted to mate with the second groove in a corresponding right side wall of the equipment rack.

Another embodiment includes an equipment rack for holding electronic modules, where the equipment rack includes: a plurality of bottom walls; a plurality of side walls, where a space between side walls and a bottom wall defines an opening for an electronic module; a plurality of first grooves on a first side of the side walls, where the first grooves are displaced by a first amount from a bottom wall of a corresponding opening; and a plurality of second grooves on a second side of the side walls, where the second grooves are displaced by a second amount from a bottom wall of a corresponding opening, where the second amount is different from the first amount.

Another embodiment includes a side wall in an equipment rack that is adapted to hold electronic modules, where the side wall includes: a first side; a second side; a first groove defined in the first side; and a second groove defined in the second side, wherein the second groove is at a different height than the first groove.

Another embodiment includes a housing for an electronic module that is adapted to slide into an opening in an equipment rack, where the housing includes: a rear side adapted to interface with the equipment rack via at least one connector; a front side; a top; a bottom; a first side wall with a first tongue, where the first tongue is at a first height with reference to the bottom, where the first tongue is adapted to slidably couple into a first groove of a corresponding wall of an equipment rack; and a second side wall opposite the first side wall, the second side wall having a second tongue that is adapted to slidably couple into a second groove of a corresponding wall of the equipment rack, where the second tongue is at a second height with reference to the bottom, where the second height is different from the first height.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention.

While illustrated generally in the context of a power supply, the principles and advantages described herein are generally applicable to other electronic modules, such as to signal processing equipment.

Figure 1:
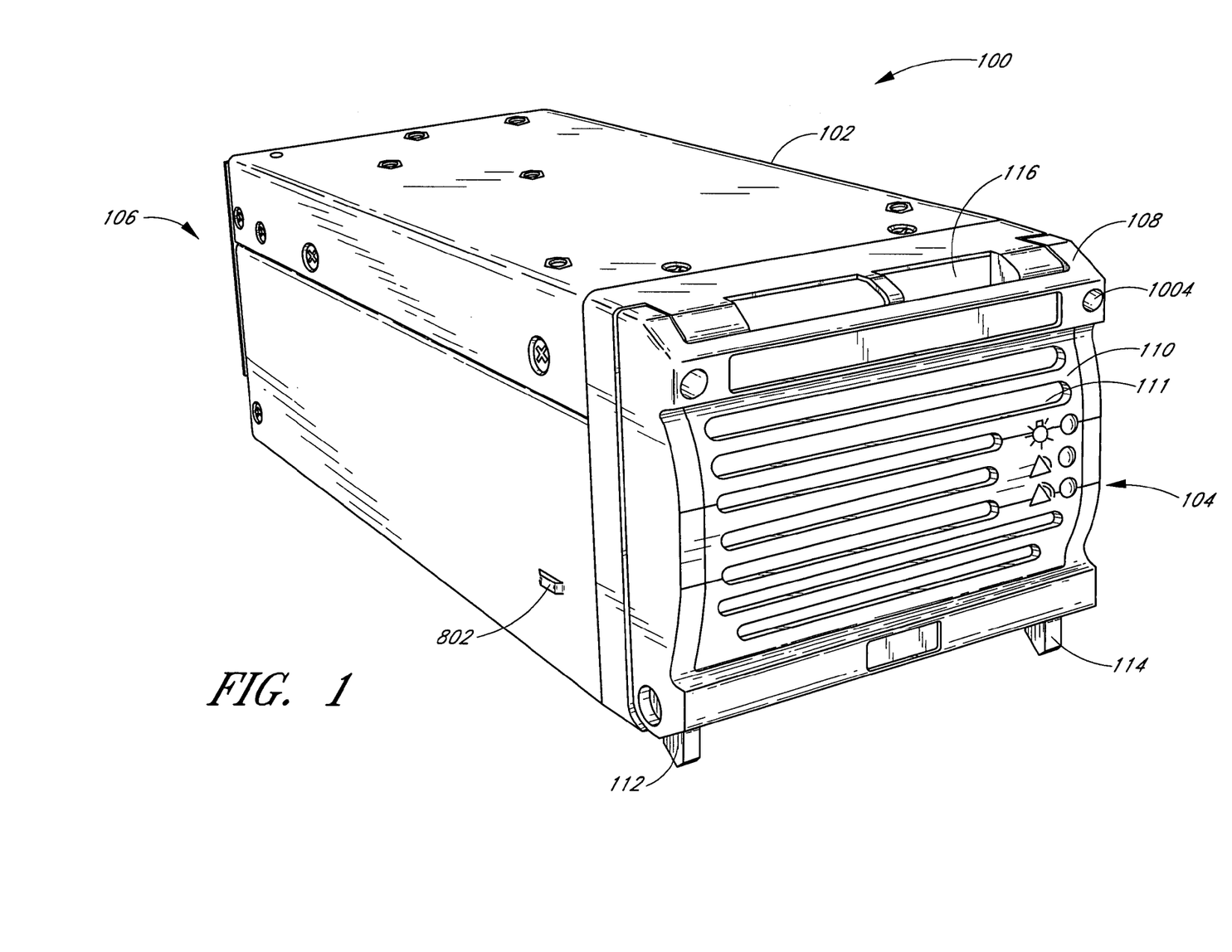
FIG. 1 is a front perspective view of an electronic module according to one embodiment of the invention.
Figure 2:
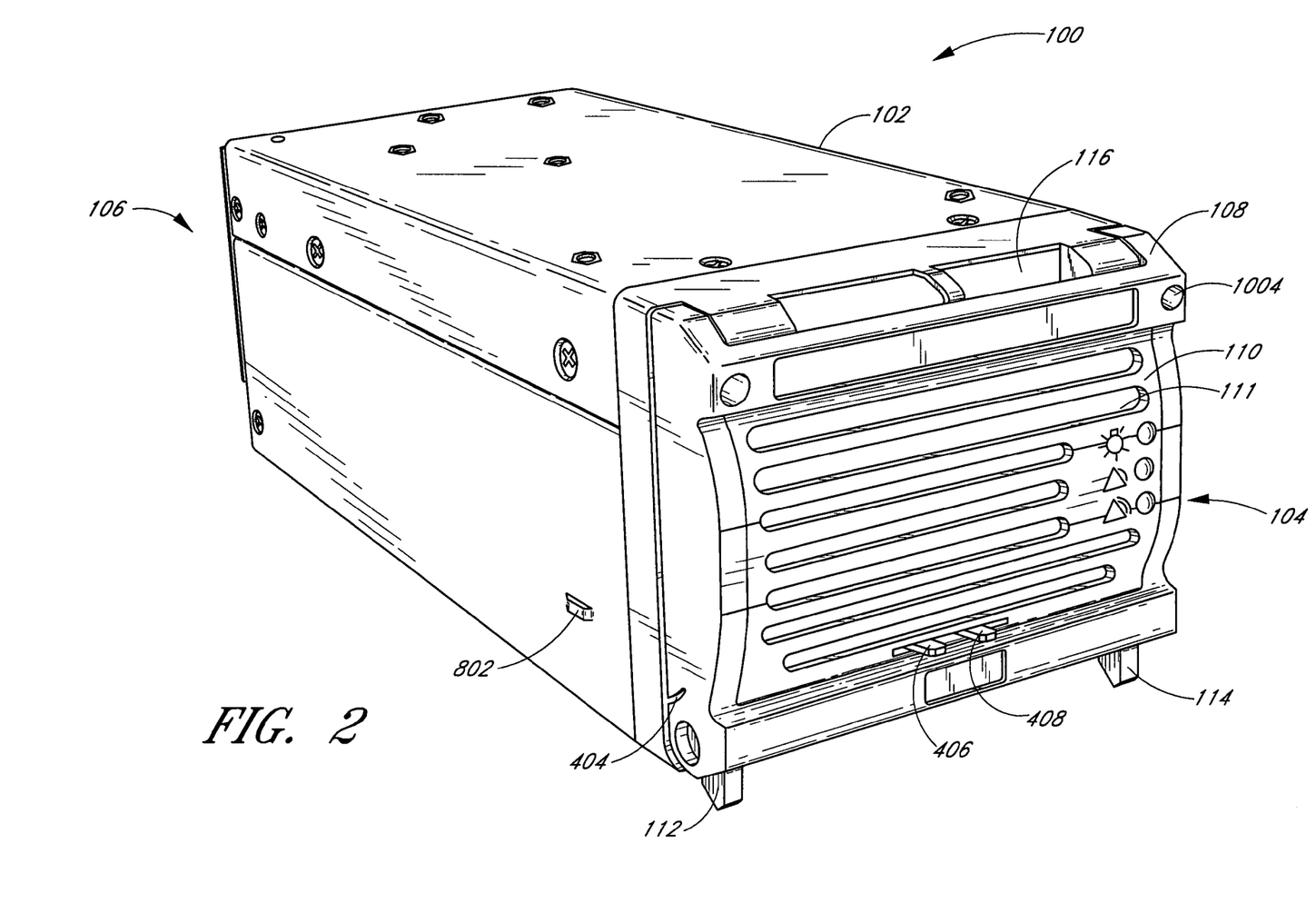
FIG. 2 is a front perspective view of an electronic module with a latch according to another embodiment of the invention.

FIGS. 1 and 2 illustrate perspective views of a power supply with a mechanical interlock. Desirably, a power supply is relatively small and efficient, which allows a rack to be smaller and lighter or hold more functional electrical equipment, such as signal processing equipment. One embodiment includes a power supply 100 wherein air flows through the power supply 100 to cool components within a housing 102 of the power supply 100. In the illustrated embodiment, air flows from a first end or front 104 to a second end or back 106; however, it will be understood that in another embodiment, air flows from the second end 106 to the first end 104. The rate of air flow can correspond to a very broad range. For example, in one embodiment, air flows at a rate of about 400 to 600 linear feet per minute (LFM). A handle 108 and a bezel 110 are also provided at the first end 104. The bezel 110 can include openings 111 to permit air to flow. One or more externally accessible electrical connectors 302, 306 are provided at the second end 106.

Figure 3:
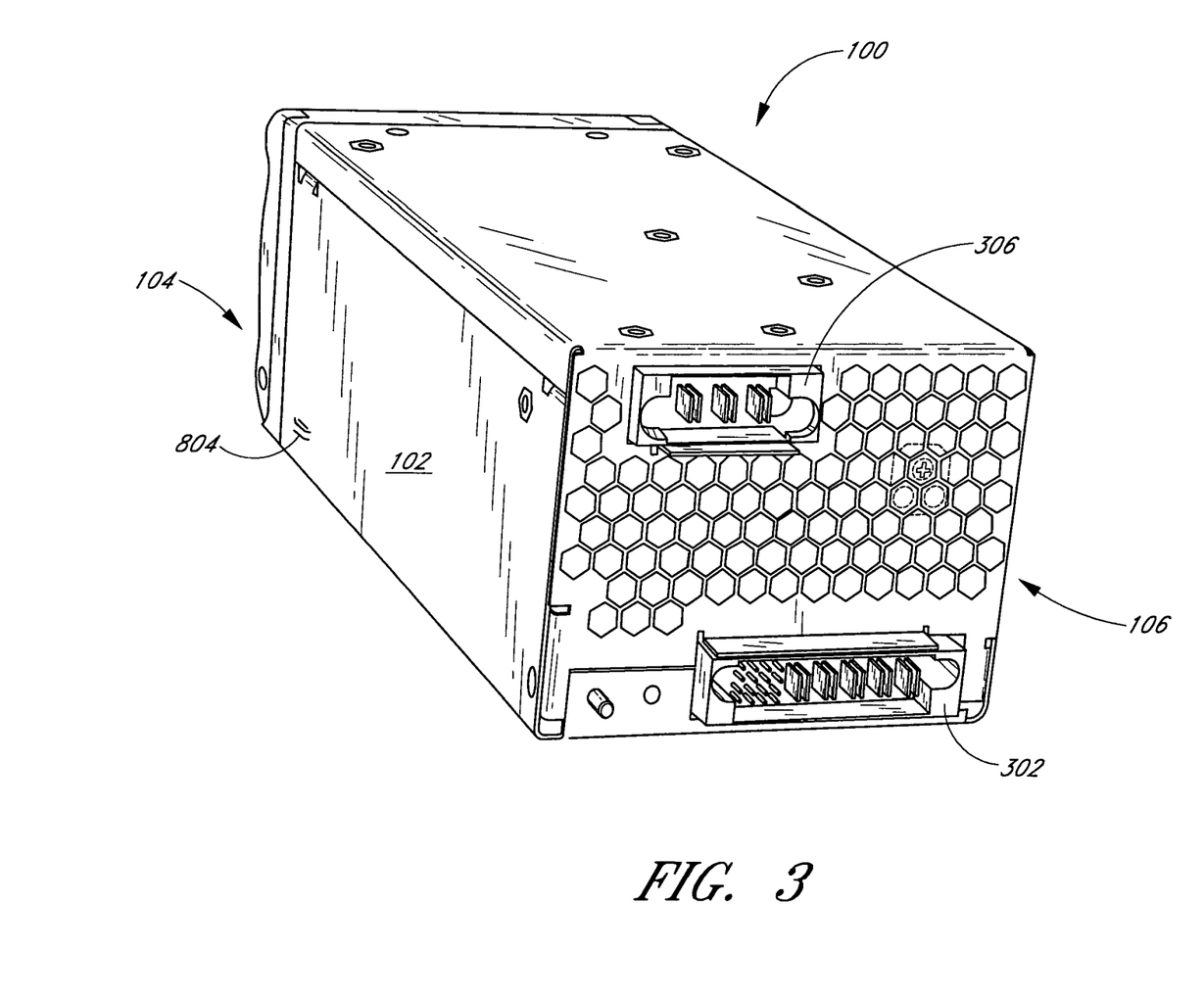
FIG. 3 is a rear perspective view of an electronic module according to one embodiment of the invention.

FIG. 3 is a rear perspective view of an electronic module configured as a power supply. The electrical connectors 302, 306 mate with prime power and with secondary power. Prime power refers to the source of power for the power supply 100 and can correspond to, for example, AC line power or "mains." Secondary power refers to the output or the output biases that are provided by the power supply 100. Typically, a power supply has relatively large output capacitors on its secondary power side. When a power supply is not plugged in or powered up, these output capacitors can be discharged, i.e., about zero volts. Upon plugging into a rack in a "hot swap" mode, i.e., plugging into a powered-up rack, the combination of existing biases and the discharged capacitors can lead to relatively large current spikes or relative large inrush current on the regular power contacts. These current spikes can cause damage to circuit boards, can cause damage to connectors, can produce transients on bias lines, etc.

Pre-Charge Contacts

To alleviate the sudden charge/discharge of current, "pre-charge" contacts can be provided on the electrical connectors. It will be understood that any form of electrical contact can be used, such as pins, sockets, blades, forks, etc. The pre-charge contacts are supplemental power contacts that are configured to make contact before regular power contacts. These pre-charge contacts typically couple the output biases of the power supply 100 through a relatively high resistance, which permits the output capacitors to gradually charge upon the insertion of the power supply 100. Typically, the pre-charge contacts are elongated such that they make contact before the regular power contacts. The pre-charge contacts can be elongated on either or both the power supply 100 or the equipment rack. In the illustrated power supply configuration, the contacts on the power supply 100 are the same length, and the pre-charge contacts on the rack are elongated relative to the regular power contacts.

Conventional pre-charge contacts do not always function as intended. When a power supply with pre-charge contacts is rapidly or hastily inserted into a power supply rack, the output capacitors may not receive enough charge through the pre-charge contacts to prevent a relatively large current spike upon connection with the regular power contacts.

Handle and Bezel

The handle 108 and the bezel 110 for the power supply 100 advantageously permits the output capacitors to receive a sufficient amount of charge from pre-charge contacts upon insertion. The handle 108 and the bezel 110 are coupled to the front of the power supply 100. For example, the handle 108 can be pivotably coupled to the bezel 110, which in turn is mounted to a front side of the housing 102. In one embodiment, the handle 108 can pivot between a first position and a second position. The handle 108 includes one or more cams 112, which will be described later in connection with FIGS. 10–12.

Figure 4:
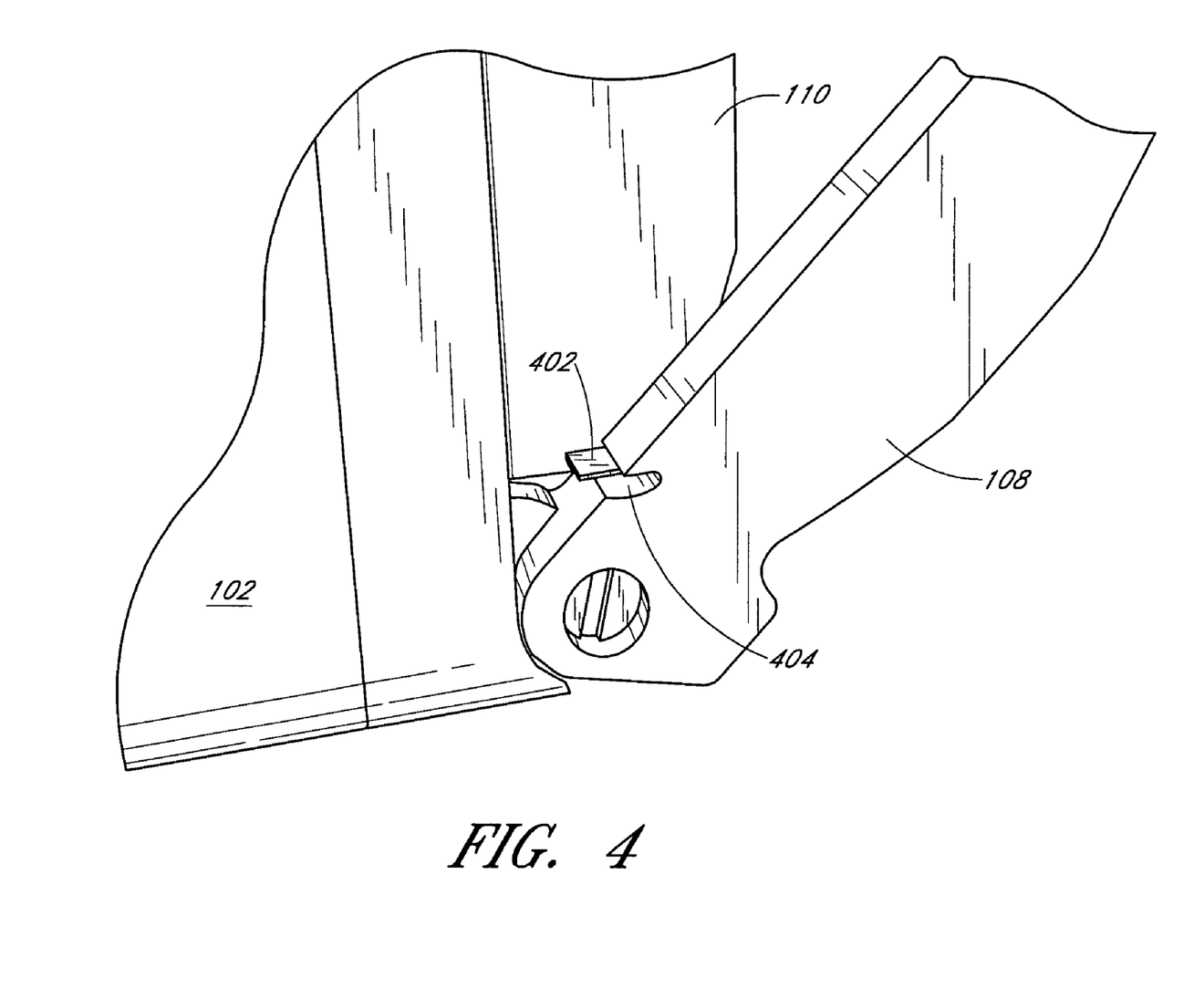
FIG. 4 illustrates a latch for a handle in a latched state.
Figure 5:
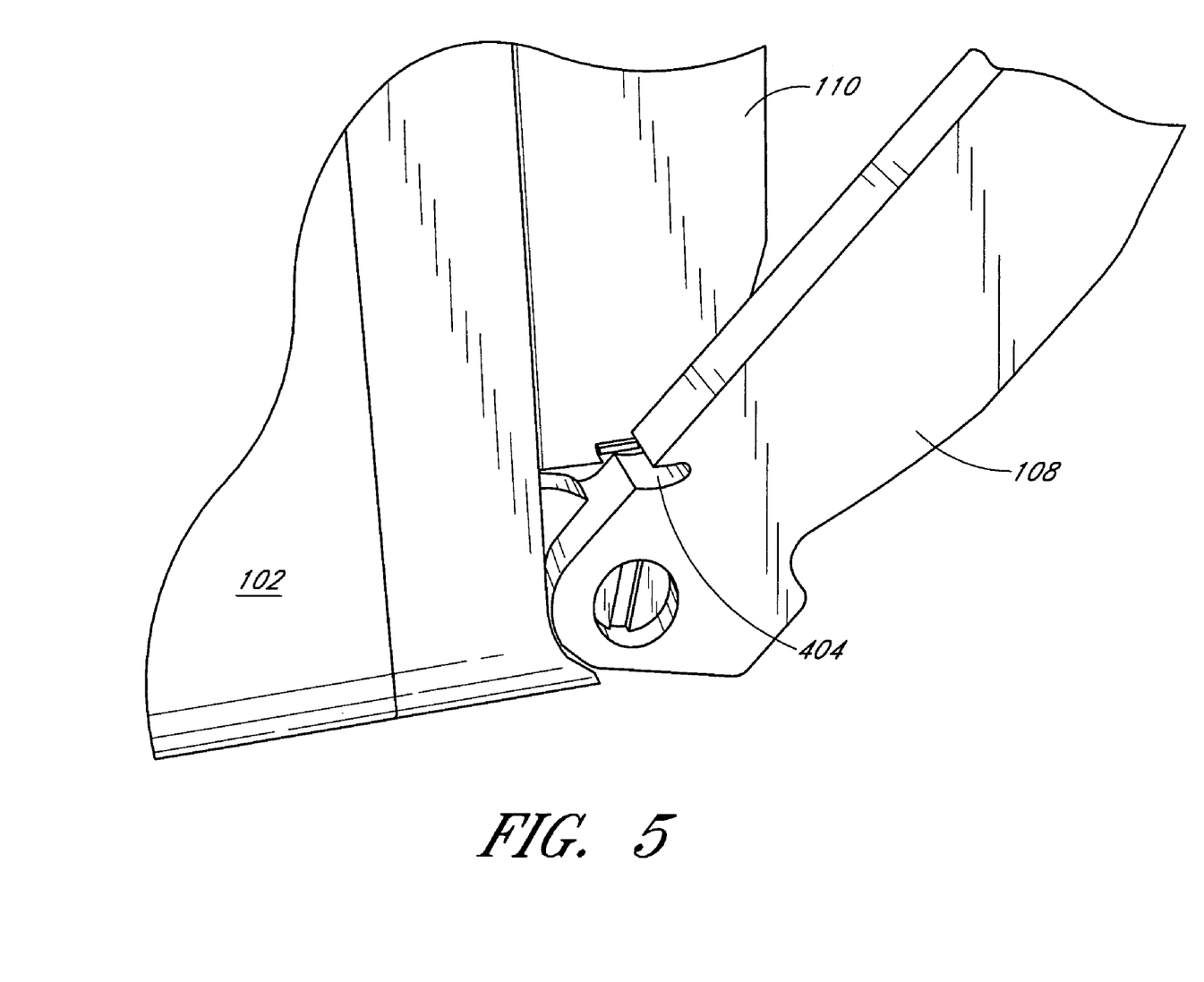
FIG. 5 illustrates a latch for a handle in an unlatched state.

In the first position, the handle 108 pivotably extends away from the bezel 110 of the power supply 100. With the handle 108 extended, the handle 108 can be used to conveniently carry the power supply 100. FIG. 1 illustrates an embodiment of the handle 108 without an optional latch. FIG. 2 illustrates an embodiment of the handle 108 with the optional latch. The handle 108 can optionally be latched or locked in the first position by a latching or locking mechanism. FIGS. 4 and 5 illustrate further details of one embodiment of a latching mechanism for the handle 108 and the bezel 110. In the illustrated embodiment, a slot 404 in the handle 108 engages with a spring-loaded pin or tongue 402 in the first position to latch or lock the handle 108. In other embodiments, holes, depressions, and/or ratcheting mechanisms can be used. In another embodiment, a latching mechanism is not used to hold the handle 108 in the first position. The power supply 100 is inserted into the rack with the handle 108 in the first position. In one embodiment, the handle 108 is arranged such that the handle 108 is extended in the first position when the power supply 100 is carried by grasping the handle 108.

Insertion/Tongue and Groove Arrangement

Figure 6:
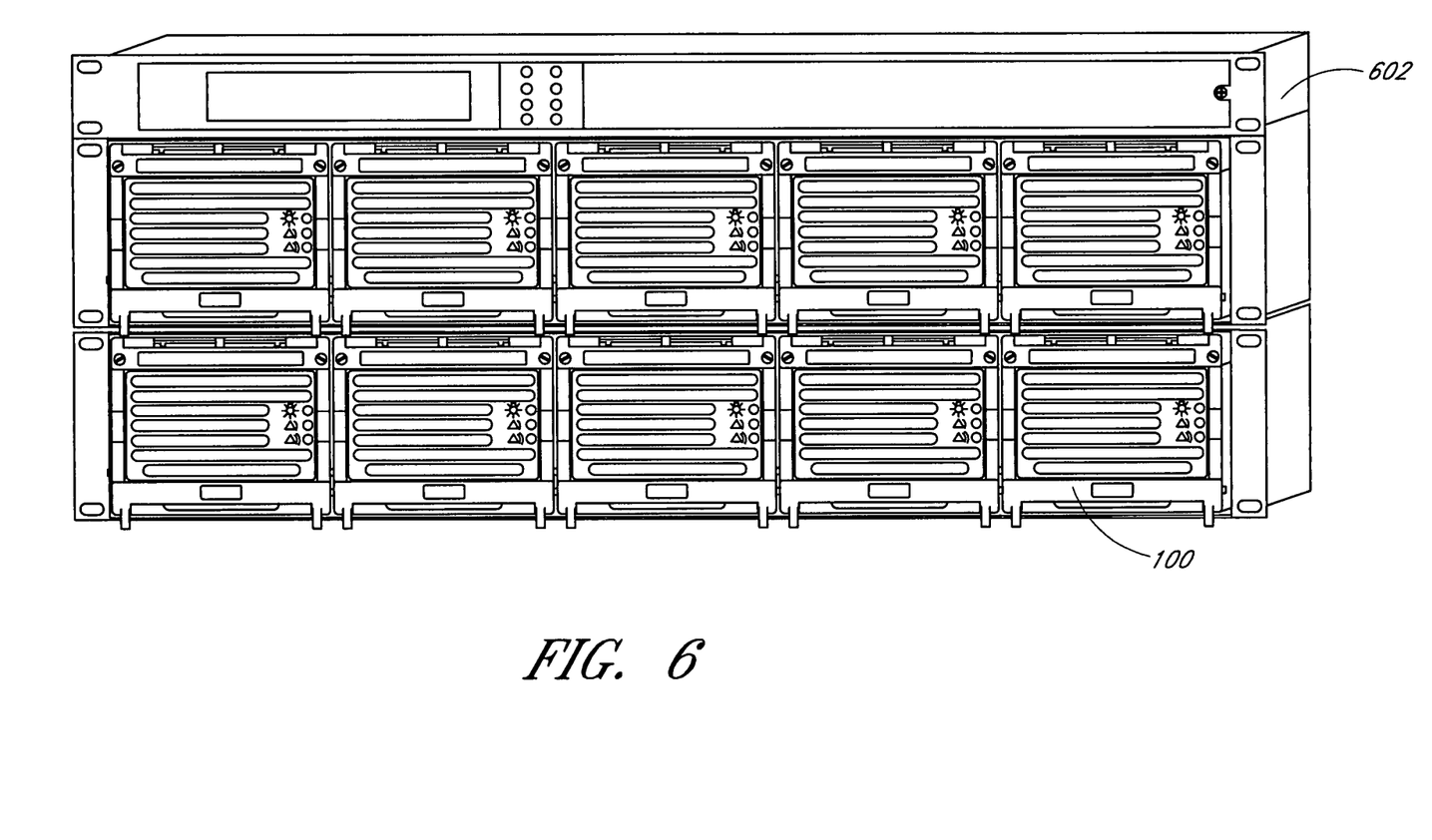
FIG. 6 illustrates one embodiment of an equipment rack.

One embodiment of the invention also includes a tongue and groove arrangement for mounting electronic modules in an equipment rack. For example, the electronic module can correspond to the power supply 100 as shown or to signal processing equipment. The equipment rack can correspond to a standard equipment rack, to a shelf for a standard equipment rack, or to customized equipment racks and shelves. For example, one embodiment of an equipment rack is configured as a shelf 602 that is adapted to fit into a standard 23-inch equipment rack and is illustrated in FIG. 6. In FIG. 6, the shelf is shown in a loaded state with a plurality of power supplies 100 installed therein. Advantageously, the tongue and groove arrangement secures electronic modules such as the power supplies illustrated in FIG. 6 in a vertical direction such that a tight-fitting upper surface in an opening of such an equipment rack is not needed.

Figure 7:
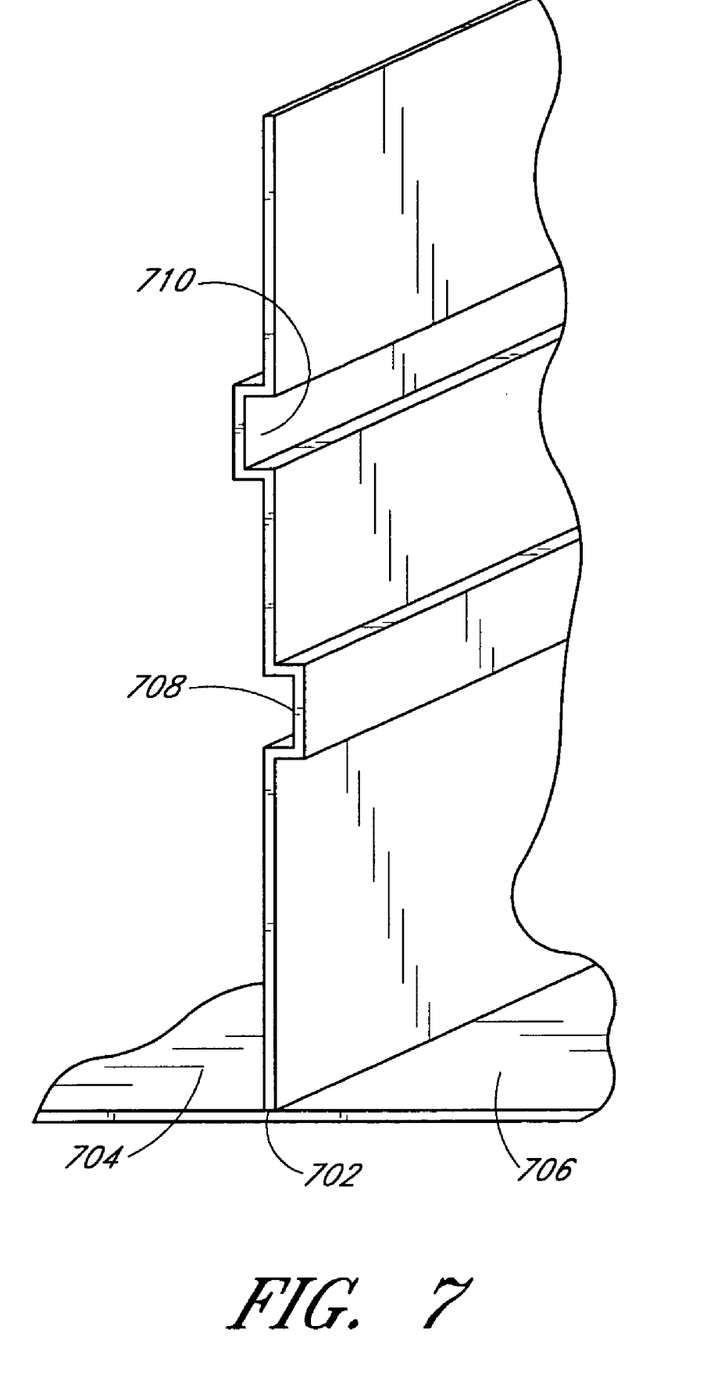
FIG. 7 illustrates one embodiment of a side wall for an equipment rack.

FIG. 7 illustrates a perspective view of a side wall 702 for an equipment rack. For example, the side wall 702 can be used in the shelf described earlier in connection with FIG. 6. A first side of the side wall 702 faces a first opening 704 for a first electronic module. An opposite side of the side wall 702 faces a second opening 706 for a second electronic module.

Figures 8, 9:
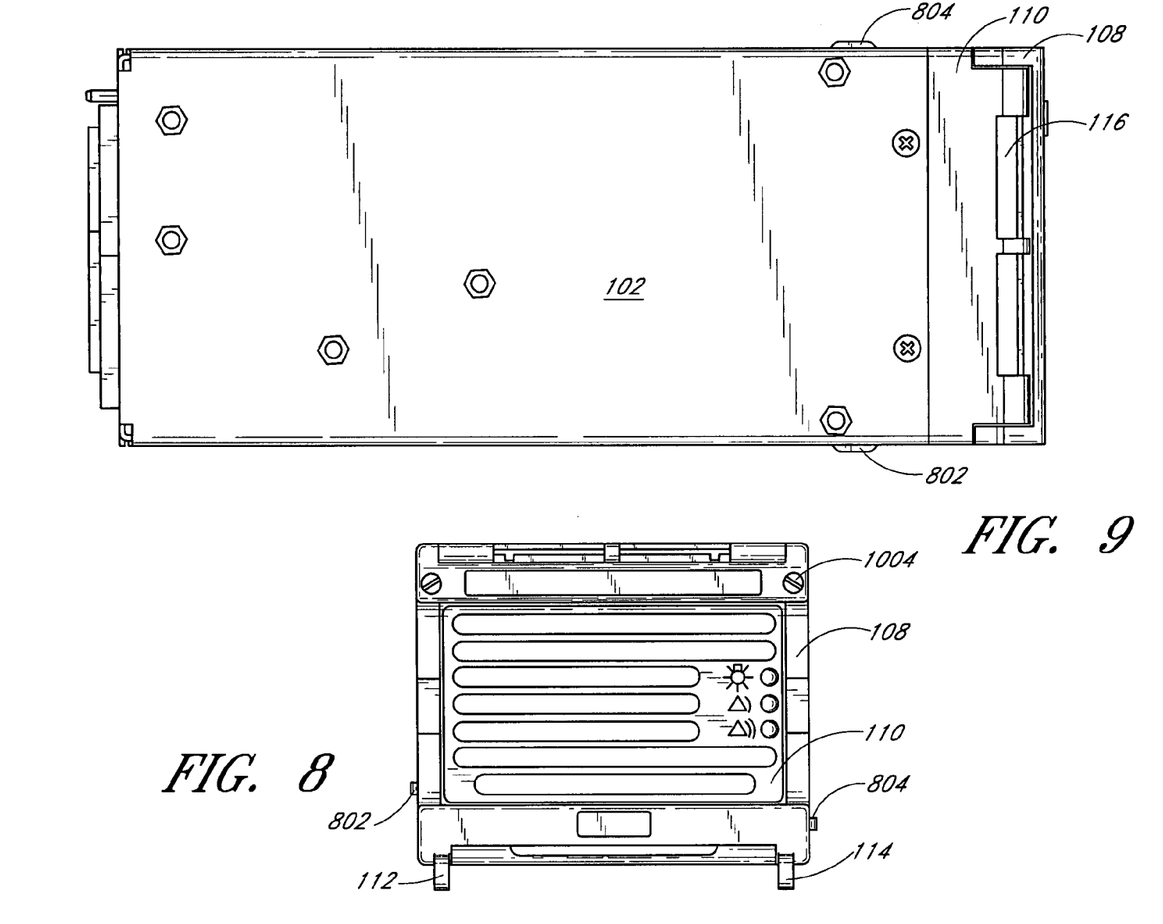
FIG. 8 illustrates a front view of an electronic module.
FIG. 9 illustrates a top view of an electronic module.

FIG. 8 illustrates a front view of an electronic module. Tongues or tabs 802, 804 on the sides of the housing 102 for the electronic modules engage with corresponding grooves or slots 708, 710 in the equipment rack illustrated in FIG. 7. In one embodiment, the right tongue 804 and the left tongue 802 are at different heights, and the corresponding grooves, slots, or channels in the side walls of the equipment rack are also at different heights as illustrated in FIG. 7. This advantageously permits the side wall 702 of the equipment rack to have a groove for a tongue of an electronic module on each side of the side wall 702. This further advantageously permits the side wall 702 of the equipment rack to be formed with a single wall thickness, such as a single sheet of metal, thereby lowering production costs and saving space.

In the illustrated electronic module, the tongue to the left 802, when viewed from the first end 104, is higher than the tongue to the right 804. In another embodiment, the tongue to the left is lower than the tongue to the right.

FIG. 9 illustrates a top view of an electronic module with the tongues or tabs 802, 804. In one embodiment, where the housing 102 is fabricated from sheet metal, the tongues 802, 804 are formed from the sheet metal by a pressing operation.

Cam and Hook Operation

Figure 10:
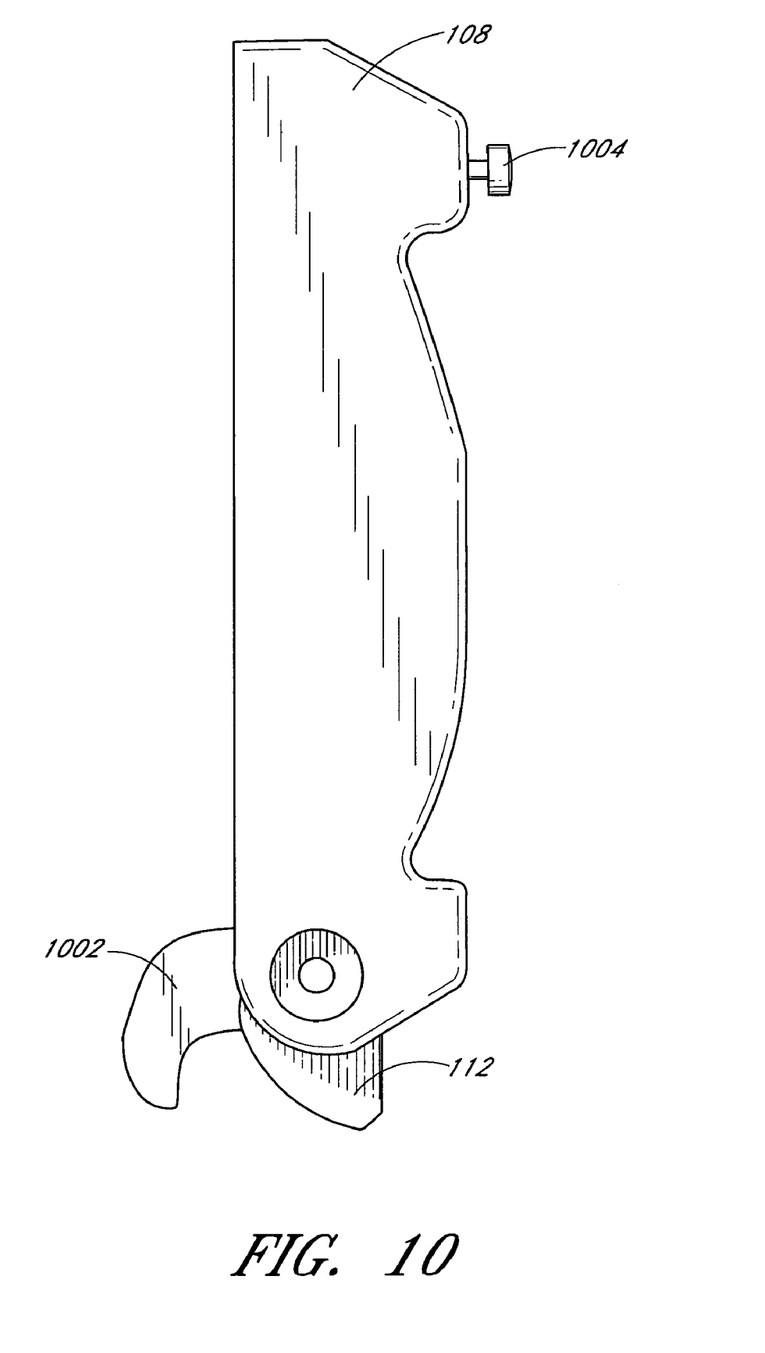
FIG. 10 illustrates a side view of a handle for an electronic module.

A side view of a cam 112 of the handle 108 is illustrated in FIG. 10. The power supply 100 is inserted until one or more cams 112, 114 or other mechanisms interferes with further insertion. The cam 112 is configured to move with movement of the handle 108 and can be integrated with the handle 108. For example, in the illustrated handle 108, the cam 112 is on the opposite side from the grasping portion of the handle 108 (opposite from the pivot for the handle) and is formed from the same piece as the handle 108. Preferably, there are at least two cams; one to the left 112, and one to the right 114.

Figure 11:
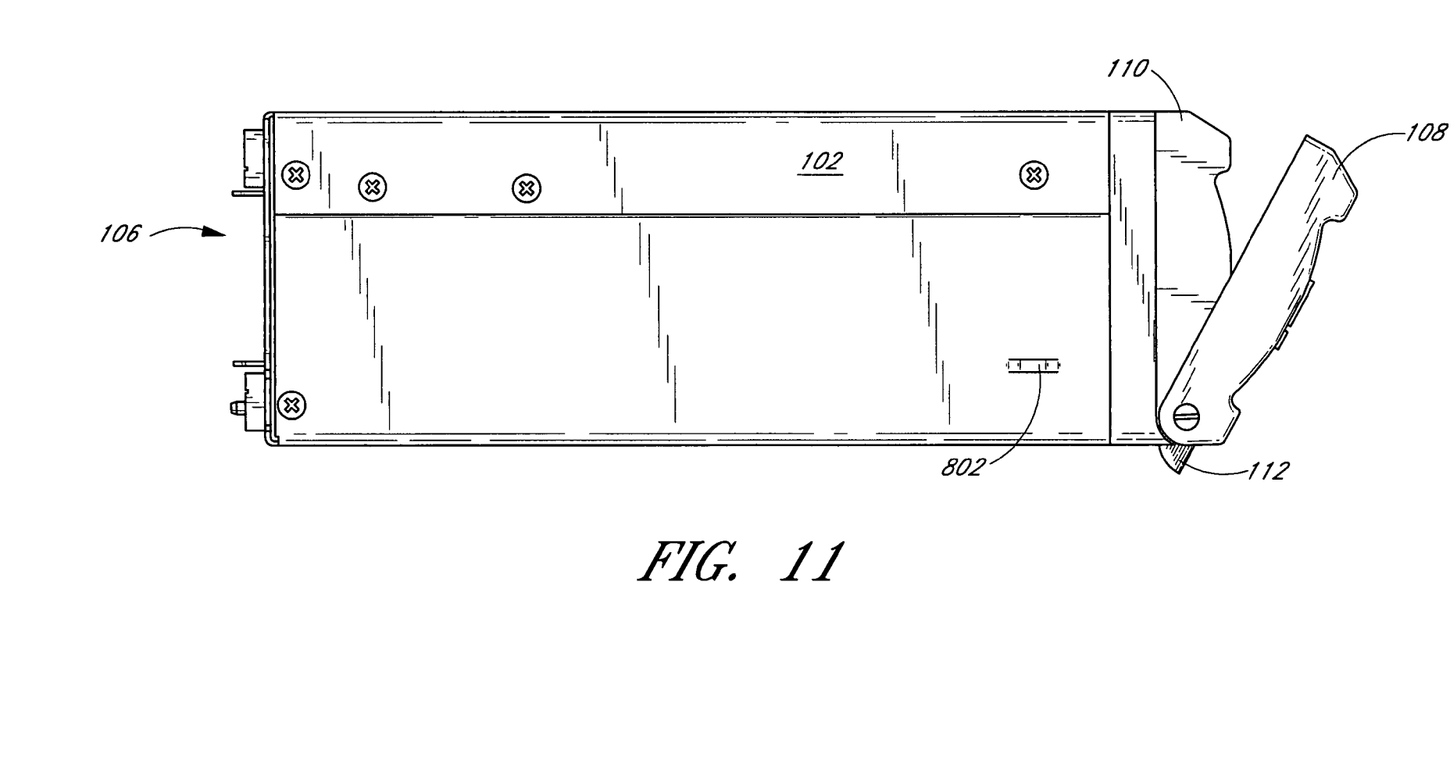
FIG. 11 illustrates a side view of an electronic module with a handle in an opened state.
Figure 12:
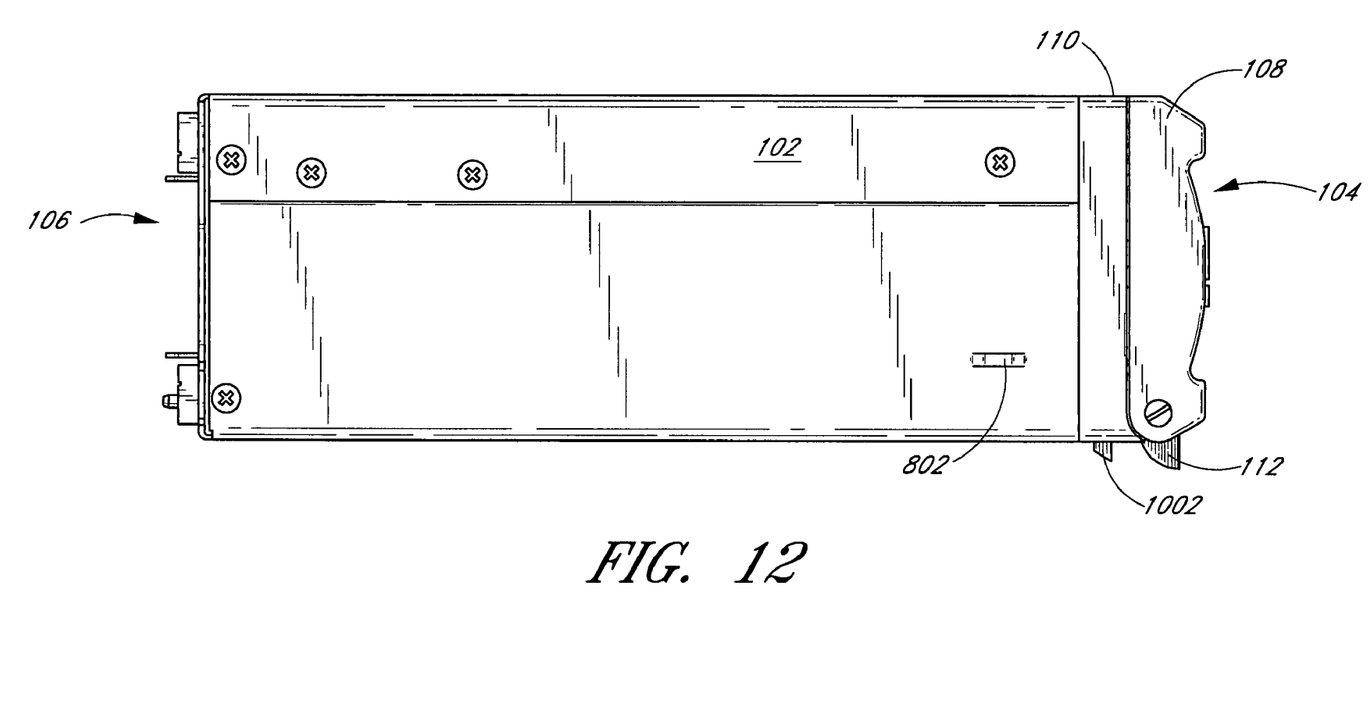
FIG. 12 illustrates a side view of a electronic module with a handle in a closed state.

With the handle 108 in the first position as illustrated in FIG. 11, the cam 112 permits engagement of the pre-charge contacts, but does not permit the engagement of the regular power contacts. This permits the output capacitors to charge up in a controlled manner and avoids relatively large current spikes. When the handle 108 is moved from the first position to the second position as illustrated in FIG. 12, the cam 112 correspondingly moves, and the regular power contacts are engaged.

In the illustrated embodiment, the handle 108 is moved from the first position to the second position by applying force to the handle 108 in the direction of the bezel 110. Where the handle 108 includes the optional latching or locking mechanism described earlier in connection with FIGS. 4 and 5, in order to move the handle 108 from the first position to the second position, the handle 108 is unlatched or unlocked from the first position. In the illustrated embodiment, the spring loaded pin or tongue 402 that engages with the slot 404 in the handle 108 is retracted to unlock the handle 108 from the first position. For example, the spring loaded pins or tongues can be coupled to two tabs 406, 408 in the front of the bezel 110, which retract the spring loaded pins when squeezed together. FIG. 5 illustrates the spring loaded pins or tongues in a retracted position. The two tabs are observable in a lower portion of FIG. 4. In one embodiment, the spring loaded pins and the tabs are fabricated from one piece of sheet metal. It will be understood that the unlatching or unlocking procedure will vary in accordance with the locking mechanism that is selected, and that the particular configuration of the locking mechanism is illustrative of one suitable locking mechanism configuration.

It will be understood that the unlatching or unlocking mechanism may not be present in all embodiments. However, where present, the optional unlocking or unlatching procedure is preferably relatively time consuming. The time consuming nature of the illustrated unlocking procedure provides the output capacitors with the time needed to charge up via current provided by the pre-charge contacts.

As the handle 108 is moved from the first position to the second position, the cam pivots away from the edge of the power supply rack, thereby permitting the power supply 100 to engage with the regular power contacts. In one embodiment, the movement of the handle 108 from the first position to the second position also moves one or more hooks 1002 that extends from the power supply 100. In the illustrated embodiment, the hook 1002 retracts from the bottom surface of the power supply 100 when the handle 108 is in the first position as illustrated in FIG. 11, and the hook 1002 extends from the bottom surface of the power supply 100 when the handle 108 is in the second position as illustrated by FIG. 12. The extension of the hook 1002 while the handle 108 is in a position other than the first position can advantageously prevent the power supply 100 from being fully inserted with the handle in a state other than the first position, such as direct insertion in the second position. This advantageously prevents bypassing of the cam-induced time-delay feature of the handle 108, which precharges the capacitors in the power supply 100.

The hook 1002 can engage with a slot, an orifice, or the like, provided at a bottom wall of the power supply rack. In the illustrated embodiment, there is one hook to the left and one hook to the right of the power supply 100. The one or more hooks 1002 advantageously pull the power supply 100 into the power supply rack with the leverage provided by the handle 108, the pivot, and the hooks 1002. This permits the power supply 100 to be relatively easily inserted into a power supply rack even when a relatively large number of contacts or pins is present. Even though the insertion force needed to insert or remove an individual contact or pin can be relatively low, when the insertion force is multiplied by a relatively large number of contacts, the insertion force for the whole power supply can rapidly grow to a relatively large force.

The force applied to move the handle 108 from the first position to the second position can also include an upward force applied to the power supply 100. Some power supply racks or equipment racks do not have tops in openings for power supplies or other electronic modules. Vertical movement from this upward force and other upward forces can be restrained by the tongues or tabs 802, 804 to the sides of the power supply, which engage with grooves, slots, channels, and the like, in side walls of the power supply rack as was described earlier in connection with FIGS. 7 and 8.

When the handle 108 is in the second position, the hooks 1002 hold the power supply in place. The hooks 1002 prevent the power supply from being unintentionally removed in the forward and/or the upward direction, by, for example, forces from vibration, transportation, earthquakes, and the like. As described earlier in connection with FIGS. 7 and 8, one embodiment of the housing 102 further includes tongues 802, 804 for mating with grooves 708, 710 in side walls of an equipment rack to prevent vertical movement of the housing 102 relative to the equipment rack. The handle 108 can optionally include a locking mechanism 1004, such as one or more fasteners, to keep the handle 108 in the second position and thereby keep the power supply 100 installed in the power supply rack.

FIG. 10 illustrates a side view of the handle 108. In the illustrated embodiment of FIG. 10, the handle 108 is locked in the second position by two relatively small screws or other fasteners. Also, a fastener used for the locking mechanism 1004 is preferably self-retained such that when loosened, it does not fall out. Preferably, a tool is needed to unlock the handle 108 from the second position. For example, a relatively small screwdriver can be used for locking and/or unlocking small screws used as fasteners of the handle 108 for the second position. The need for a tool advantageously provides at least a layer of protection from inadvertent or undesired removal of a power supply or other electronic module by a user without the tool. The presence of the locking mechanism 1004 integrated into the handle 108 advantageously obviates against the need for a separate locking mechanism.

To remove the power supply, the handle 108 is moved from the second position to the first position. In the illustrated embodiment, a space 116 is defined between the handle 108 and the bezel 110 when the handle is in the second position to permit a user to grasp a grasping area of the handle 108. Movement of the handle 108 from the second position to the first position disengages the hooks 1002 from the rack. Further, movement of the handle 108 from the second position to the first position moves the cams that are coupled to the handle 108. As the handle 108 is moved, the one or more cams 112, 114 push against the front edge of the bottom surface of the rack and help to eject the power supply 100 from the power supply rack. A relatively large number of contacts in the power supply 100 can render the insertion and removal force relatively high. The leverage provided by the handle 108, the pivot, and the cam, advantageously permit removal of the power supply with relatively little effort.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A modular electronic system using a tongue and groove arrangement to restrain motion of electronic modules, the modular electronic system comprising:

an equipment rack with a plurality of openings for receiving electronic modules, wherein an opening is defined by a left side wall, a right side wall, and a bottom surface, where the left side wall has a first side and a second side and further defines-a first groove on the first side of the left side wall disposed a first height above the bottom surface and a second groove on the second side of the left side wall at a second height above the bottom, the second height different than the first height, where the right side wall further defines a third groove disposed the second height above the bottom surface, where the first groove faces the opening and the second groove does not face the opening; and a plurality of electronic modules with housings adapted to slidably couple into openings of the equipment rack, where a housing for an electronic module further comprises at least a left side wall and a right side wall, where the left side wall of the electronic module comprises a first tongue that is adapted to slidably mate with the first groove in a corresponding left side wall of the equipment rack, and where the right side wall of the electronic module comprises a second tongue that is adapted to slidably mate with the third groove in a corresponding right side wall of the equipment rack.

2. The modular electronic system as defined in claim 1, wherein the opening in the equipment rack that is defined by the left side wall, the right side wall, and the bottom surface does not have an upper surface for restraining vertical movement of an electronic module.

3. The modular electronic system as defined in claim 1, wherein a first side of a single side wall defines the left side wall with the first groove for the opening, and where a second side of the single side wall defines a right side wall with a second groove for a second opening.

4. The modular electronic system as defined in claim 1, wherein at least one of the electronic modules corresponds to a power supply.

5. An equipment rack for holding electronic modules, the equipment rack comprising:

a plurality of bottom walls;

a plurality of side walls, where a space between side walls and a bottom wall defines an opening for an electronic module, where at least one side wall has a first surface and a second surface, where the first surface and the second surface are on opposite sides of the at least one side wall;

a first groove on the first surface of the at least one side wall, where the first groove is displaced by a first amount from the bottom wall, and the first groove faces the opening; and and the second groove on the second surface of the at least one side wall, where the second groove is displaced by a second amount from the bottom wall and the second groove faces an adjacent opening, where the second amount is different from the first amount.

6. The equipment rack as defined in claim 5, wherein an opening in the equipment rack that is defined in the space between the first surface of a first side wall, a second surface of a second side wall, and a bottom surface does not have an upper surface for restraining vertical movement of an electronic module disposed therein.

7. The equipment rack as defined in claim 5, wherein the first side of the side wall and the second side of the side wall comprise opposite sides of a single wall.

8. A side wall separating first and second adjacent openings in an equipment rack that is adapted to hold electronic modules, the side wall comprising:
   a first side;
   a second side of the same side wall as the first side, where the second side is a reverse side of the first side;
   a first groove defined in the first side and facing the first opening; and
   a second groove defined in the second side and facing the second opening, wherein the second groove is at a different height than the first groove.

9. The side wall as defined in claim 8, wherein the side wall is fabricated from a single sheet of metal.

10. The side wall as defined in claim 8, where the first groove on the first side is adapted to mate with a first tongue on a first side of an electronic module, and where the second groove on the second side is adapted to mate with a second tongue on a second side of another electronic module, where the second side is opposite to the first side.

11. A housing for an electronic module that is adapted to slide into an opening in an equipment rack, the housing comprising:
   a rear side adapted to interface with the equipment rack via at least one connector;
   a front side;
   a top;
   a bottom;
   a first side wall with a first tongue, where the first tongue is at a first height with reference to the bottom, where the first tongue extends outward from the first side wall, where the first tongue is adapted to slidably couple into a first groove of a corresponding wall of an equipment rack; and
   a second side wall opposite the first side wall, the second side wall having a second tongue that is adapted to slidably couple into a second groove of a corresponding wall of the equipment rack, where the second tongue extends outward from the second side wall, where the second tongue is at a second height with reference to the bottom, where the second height is different from the first height, and where there is no tongue on the second side wall at the first height.

12. The housing for the electronic module as defined in claim 11, wherein the electronic module corresponds to a power supply.

13. The housing for the electronic module as defined in claim 11, wherein the at least one connector comprises a plurality of connectors.

14. A power supply that embodies the housing of claim 11.

15. The modular electronic system as defined in claim 1, wherein the left side wall is formed with a single wall thickness.

16. The equipment rack as defined in claim 5, wherein the at least one side wall is formed with a single wall thickness.

17. The side wall as defined in claim 9, wherein the side wall fabricated from the single sheet of metal is formed with a single wall thickness.

* * * * *